United States Patent
Keeth et al.

[11] Patent Number: 5,870,347
[45] Date of Patent: *Feb. 9, 1999

[54] MULTI-BANK MEMORY INPUT/OUTPUT LINE SELECTION

[75] Inventors: Brent Keeth; Troy A. Manning, both of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 814,500

[22] Filed: Mar. 11, 1997

[51] Int. Cl.$^6$ .................................................. G11C 8/00
[52] U.S. Cl. .............................. 365/230.03; 365/230.04; 365/230.06
[58] Field of Search ................. 365/230.03, 230.06, 365/230.04

[56] References Cited

U.S. PATENT DOCUMENTS

| | | | |
|---|---|---|---|
| 4,096,402 | 6/1978 | Schroeder et al. | 307/362 |
| 4,404,474 | 9/1983 | Dingwall | 307/260 |
| 4,638,187 | 1/1987 | Boler et al. | 307/451 |
| 4,789,796 | 12/1988 | Foss | 307/443 |
| 4,958,088 | 9/1990 | Farah-Bakhsh et al. | 307/443 |
| 4,984,204 | 1/1991 | Sato et al. | 365/189.11 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hesson | 370/270 |
| 5,179,298 | 1/1993 | Hirano et al. | 307/443 |
| 5,194,765 | 3/1993 | Dunlop et al. | 307/443 |
| 5,220,208 | 6/1993 | Schenck | 307/443 |
| 5,239,206 | 8/1993 | Yanai | 307/272.2 |
| 5,254,883 | 10/1993 | Horowitz et al. | 307/443 |
| 5,274,276 | 12/1993 | Casper et al. | 307/443 |
| 5,276,642 | 1/1994 | Lee | 365/189.04 |
| 5,278,460 | 1/1994 | Casper | 307/296.5 |
| 5,281,865 | 1/1994 | Yamashita et al. | 307/279 |
| 5,311,481 | 5/1994 | Casper et al. | 365/230.06 |

(List continued on next page.)

FOREIGN PATENT DOCUMENTS

| | | | |
|---|---|---|---|
| 0450871 | 10/1991 | European Pat. Off. | |
| 0655741 | 5/1995 | European Pat. Off. | |
| 0680049 | 11/1995 | European Pat. Off. | |
| 2-112317 | 4/1990 | Japan | H03K 17/16 |
| 4-135311 | 8/1992 | Japan | H03K 5/13 |
| 5-136664 | 1/1993 | Japan | H03K 5/13 |
| 05282868 | 10/1993 | Japan . | |
| 97/03445 | 1/1997 | WIPO | G11C 7/00 |
| 97/14289 | 4/1997 | WIPO . | |
| 97/15055 | 4/1997 | WIPO | G11C 7/00 |

OTHER PUBLICATIONS

Taguchi, et al., "A 40–ns 64–Mb DRAM with 64–b Parallel Data Bus Architecture", *IEEE J. Solid–State Circuits, 26*, 1493–1497, (Nov. 1991).

Primary Examiner—Viet Q. Nguyen
Assistant Examiner—Hien Nguyen
Attorney, Agent, or Firm—Seed and Berry LLP

[57] ABSTRACT

A multi-bank memory includes memory cells arranged in individually selectable banks that share column select signals. The memory cells are addressed by a row decoder that activates word lines to couple data onto digit lines. The digit lines are coupled to input/output lines through first and second series-connected switches. The first switches are input/output switches that are controlled by column select signals that are shared between multiple banks. The second switches are bank select switches that are controlled by a bank decoder, for coupling only one of the banks to input/output lines and isolating the other banks from input/output lines. The invention reduces timing requirements between operations in different banks, and allows concurrent operations in different banks, thereby increasing the speed at which the memory operates.

17 Claims, 6 Drawing Sheets

U.S. PATENT DOCUMENTS

| | | | |
|---|---|---|---|
| 5,321,368 | 6/1994 | Hoelzle | 328/63 |
| 5,347,177 | 9/1994 | Lipp | 307/443 |
| 5,347,179 | 9/1994 | Casper et al. | 307/451 |
| 5,361,002 | 11/1994 | Casper | 327/530 |
| 5,390,308 | 2/1995 | Ware et al. | 395/400 |
| 5,400,283 | 3/1995 | Raad | 365/203 |
| 5,438,545 | 8/1995 | Sim | 365/189.05 |
| 5,440,260 | 8/1995 | Hayashi et al. | 327/278 |
| 5,457,407 | 10/1995 | Shu et al. | 326/30 |
| 5,473,575 | 12/1995 | Farmwald et al. | 365/230.06 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 328/38 |
| 5,515,327 | 5/1996 | Farnwald et al. | 395/309 |
| 5,568,077 | 10/1996 | Sato et al. | 327/199 |
| 5,574,698 | 11/1996 | Raad | 365/230.06 |
| 5,576,645 | 11/1996 | Farwell | 327/94 |
| 5,578,941 | 11/1996 | Sher et al. | 326/34 |
| 5,581,197 | 12/1996 | Motley et al. | 326/30 |
| 5,590,073 | 12/1996 | Arakawa et al. | 365/185.08 |
| 5,619,473 | 4/1997 | Hotta | 365/238.5 |
| 5,621,690 | 4/1997 | Jungroth et al. | 365/200 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutami et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,650,971 | 7/1997 | Longway et al. | 365/207 |
| 5,668,763 | 9/1997 | Fujioka et al. | 365/200 |
| 5,694,065 | 12/1997 | Hamasaki et al. | 327/108 |

MULTI-BANK MEMORY INPUT/OUTPUT LINE SELECTION

TECHNICAL FIELD OF THE INVENTION

This invention relates generally to semiconductor integrated circuit memories and particularly to multi-bank dynamic random access memories (DRAMs).

BACKGROUND OF THE INVENTION

Semiconductor memory manufacturing technology allows the creation of high density memories on an integrated circuit chip. Such memories typically consist of an array of many memory cells arranged in a matrix of rows and columns. Each memory cell can be uniquely addressed by its particular row and column. The cell array is sometimes divided into numerous subarrays that share certain peripheral and interface components such as, for example, shared sense amplifiers, column select lines, and input/output (I/O) lines for performing reading and writing operations.

Sharing components and control signals, such as between the subarrays, allows efficient utilization of available integrated circuit chip area and may reduce power consumption. However, shared components and signals may constrain data accessibility. In a memory in which components and signals are shared, each memory cell is still uniquely addressable. However, not all memory cells are simultaneously addressable due to the shared components. As a result, the throughput of the reading and writing operations is reduced. There is a need in the art to provide a memory architecture that allows the sharing of components and signals and also provides more flexible addressing of memory cells to enhance the speed of reading and writing operations and to provide more robust timing during these operations.

SUMMARY OF THE INVENTION

The present invention provides a memory architecture having more flexible addressing of memory cells. The memory includes a column of memory cells that are selectively coupled to an input/output line through first and second series-connected switches. The first switch is an input/output switch that is controlled by a column select signal. The second switch is a bank switch that is controlled by a bank select signal.

In one embodiment, the memory includes an array of memory cells arranged in separately addressable banks. Input/output lines communicate data between the memory cells and external connections. A column decoder provides column select signals that are shared between banks. Each column select signal selects columns of memory cells in more than one bank for coupling to one of the input/output lines. A bank decoder individually selects each of the banks for coupling columns of memory cells in the selected bank to input/output lines. Columns of memory cells in other banks are isolated from their input/output lines. Bank switches, controlled by the bank decoder, each couple one of the input/output lines to one of the banks. Digit lines in each bank are coupled to memory cells therein. Input/output switches, each controlled by a column select signal, couple one of the digit lines in one of the banks to one of the input/output lines through one of the bank switches. Word lines in each bank are coupled to ones of the memory cells therein. Each word line defines a row of memory cells. A row decoder controls each word line, selecting a row of memory cells for coupling to ones of the digit lines in one of the banks.

The teachings of the present invention also include a method of coupling a column of memory cells to an input/output line. A column of memory cells is selected based upon a column select signal. The selected column of memory cells is coupled to the input/output line through an input/output switch and through a bank switch that is in series with the input/output switch.

One embodiment of the invention includes a method of using an array of memory cells arranged in separately addressable banks. A first bank is selected. A memory operation is performed upon memory cells in the first bank. Memory cells in the first bank are coupled to input/output lines. A second bank is selected. A memory operation is initiated upon memory cells in the second bank while the first bank is still coupled to the input/output lines.

Thus, the present invention provides a memory architecture having more flexible addressing of memory cells. The addressing of the present invention enhances the speed of reading and writing operations and provides more robust timing during these operations.

BRIEF DESCRIPTION OF THE DRAWINGS

In the drawings, like numerals describe substantially similar components throughout the several views.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the scope of the present invention. The following detailed description is, therefore, not to be taken in a limiting sense, and the scope of the present invention is defined by the appended claims and their equivalents.

Figure 1:
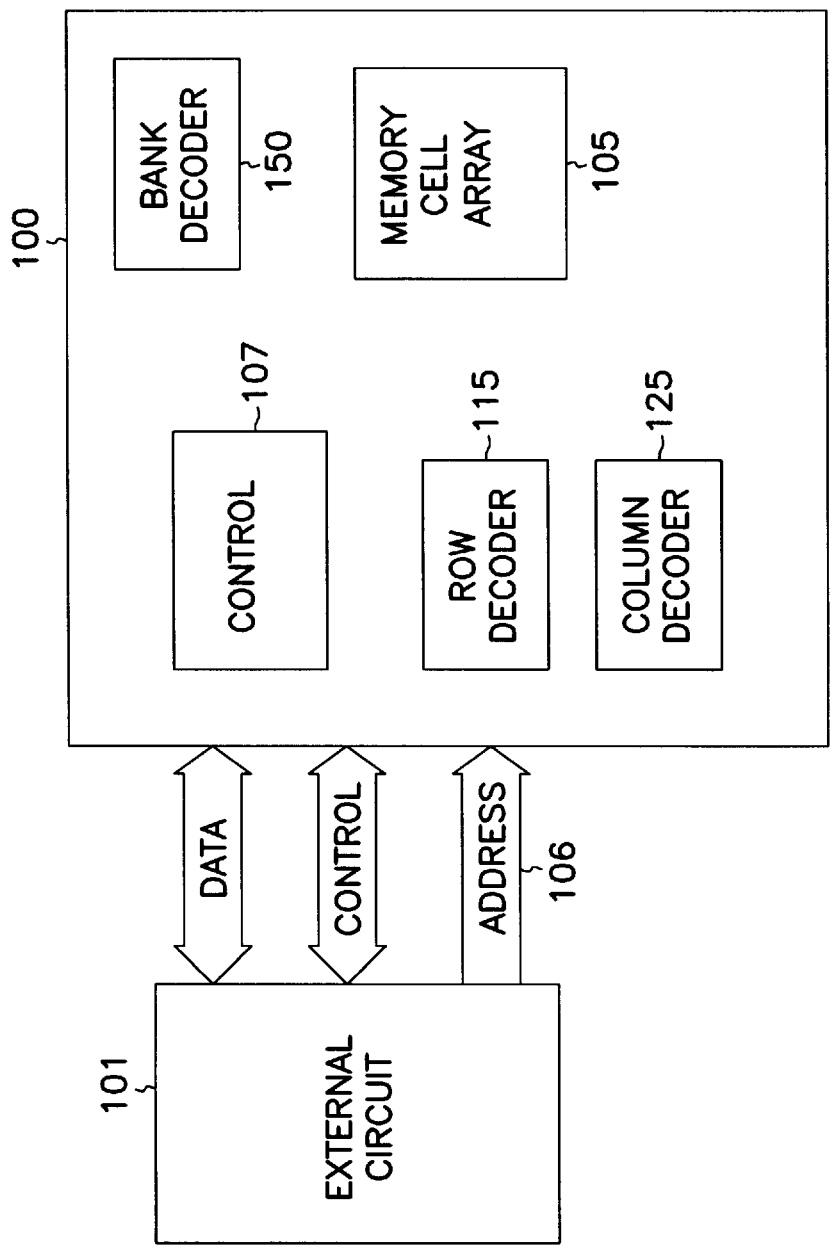
FIG. 1 is a schematic diagram illustrating generally one embodiment of a memory according to the invention.

FIG. 1 is a schematic diagram illustrating generally one embodiment of a memory 100 according to the teachings of the present invention. In the embodiment of FIG. 1, memory 100 is dynamic random access memory (DRAM). However, the invention can be applied to other semiconductor memory devices, such as SLDRAM, RDRAM, static random access memories (SRAMs), electrically erasable and programmable read only memories (EEPROMs), synchronous random access memories or other types of memories that include a matrix of selectively addressable memory cells.

In FIG. 1, memory 100 and external circuit 101 include a single or multiple integrated circuits that are used together for the storage of binary data in a memory cell array 105. Memory cell array 105 is arranged in banks of memory cells, as described below. External circuit 101 is a microprocessor, memory controller, or any other suitable circuit that provides control signals to memory 100 for its operation. External circuit 101 also provides address signals at node/bus 106 to memory 100 for identifying and accessing a particular memory cell in memory cell array 105. Data is transferred between memory 100 and external circuit 101 during reading and writing operations. External circuit 101 may also use a shared bus for data, control, or address signals. Memory 100 includes control logic circuits 107 for controlling its operations. Memory 100 also includes addressing functionality, including row decoder 115, column decoder 125, and bank decoder 150, as described below.

Figure 2:
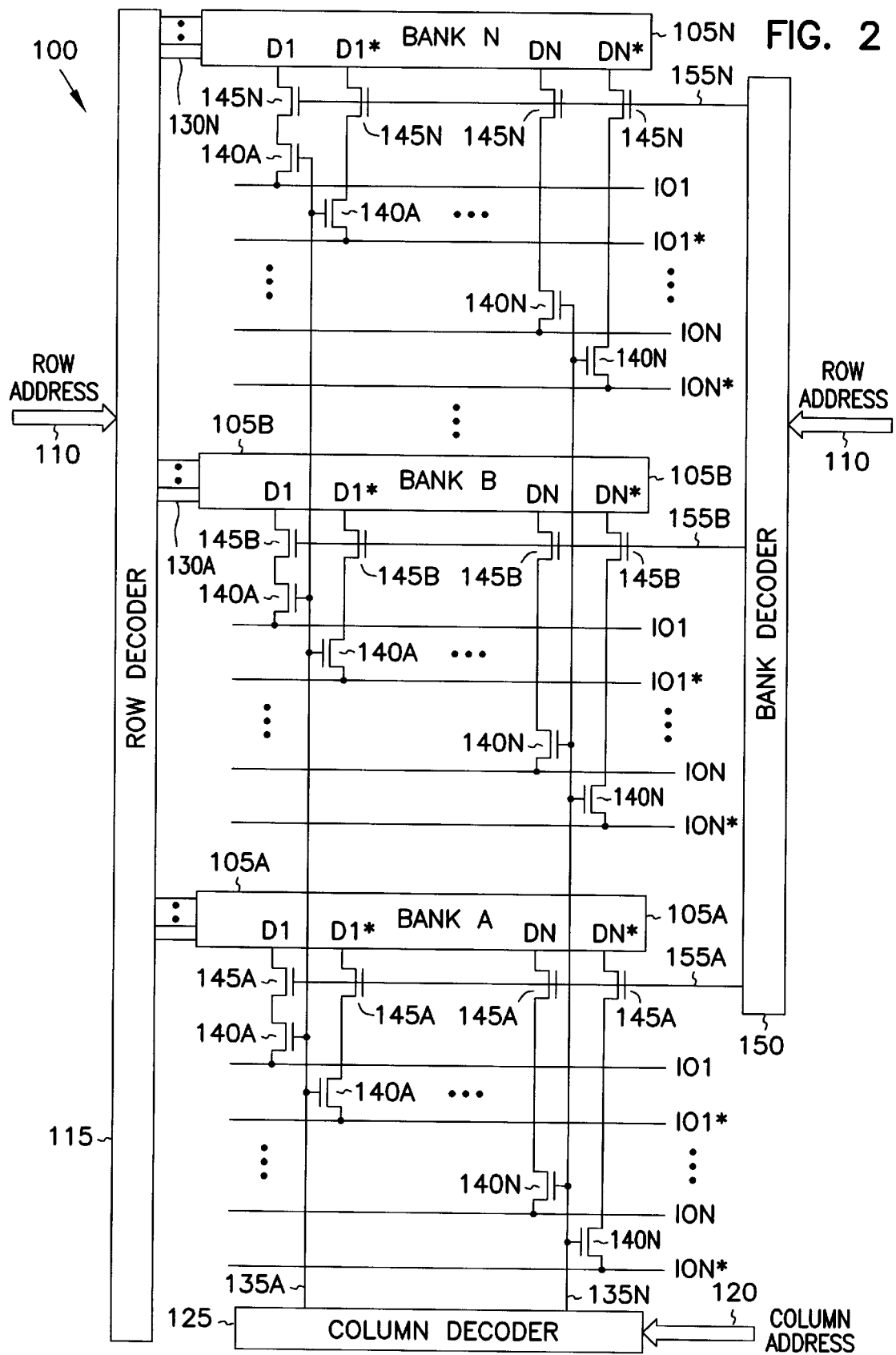
FIG. 2 is a schematic diagram illustrating generally one embodiment of an architecture of portions of a memory according to the invention.

FIG. 2 is a schematic diagram illustrating generally one embodiment of an architecture of portions of a memory 100 according to the teachings of the present invention. In FIG. 2, memory cell array 105 includes a plurality of memory cell banks, illustrated generally by banks 105A–N. Each bank 105A–N carries a plurality of memory cells arranged in rows and columns. Each memory cell is uniquely addressable by external circuit 101, which provides an address at node/bus 106 that includes or is decoded into a row address at node/bus 110 that is provided to row decoder 115 and also includes a column address at node/bus 120 that is provided to column decoder 125. Row decoder 115 receives the row address at node/bus 110 and activates, in response thereto, one of a plurality of word lines such as word lines 130A–N, thereby addressing a row of memory cells in one of the banks 105A–N. Column decoder 125 receives the column address at node/bus 120 and activates, in response thereto, one of a plurality of column select lines such as column select lines 135A–N.

The activated one of column select lines 135A–N activates isolation switches, such as ones of input/output switches 140A–N. The activated ones of input/output switches 140A–N couple a digit line pair in each bank 105A–N, such as one of true digit lines D1–DN and a corresponding one of complementary digit lines D1*–DN*, to a respective one of true input/output lines IO1–ION and one of complementary input/output lines IO1*–ION*. Coupling a pair of true and complementary digit lines to true and complementary input/output lines advantageously allows differential sensing, however, coupling a single digit line to an input/output line for single-ended sensing is also possible. Isolation switches, such as one of bank switches 145A–N, are interposed between each of the input/output switches 140A–N and its respective bank 105A–N.

In one embodiment, portions of input/output lines IO1–ION and IO1*–ION* corresponding to each one of banks 105A–N are separately multiplexed onto a common (shared) portion of input/output lines IO1–ION and IO1*–ION* for communication with external connections such as external circuit 101. In another embodiment global input/output lines IO1–ION and IO1*–ION* are shared between banks 105A–N, i.e. no multiplexing is needed.

In one embodiment, bank decoder 150 activates one of bank select lines 155A–N based upon the row address received at node/bus 110. The activated one of bank select lines 155A–N turns on ones of the bank switches 145A–N, such that the other banks 105A–N remain isolated from input/output lines IO1–ION and IO1*–ION*. Thus, even though column select lines 135A–N are shared between multiple ones of banks 105A–N, the bank switches 145A–N ensure that only those digit lines D1–DN and D1*–DN* in a single one of the banks 105A–N are coupled to the input/output lines IO1–ION and IO1*–ION*. This allows certain capacitance-sensitive memory operations to be performed in the banks 105A–N that aren't coupled to the input/output lines IO1–ION and IO1*–ION*. Furthermore, in an embodiment where global input/output lines IO1–ION and IO1*–ION* are used, bank switches 145A–N may also be used to ensure that digit lines D1–DN and D1*–DN* in different ones of banks 105A–N do not simultaneously contend for input/output lines IO1–ION and IO1*–ION*.

For example, word lines 130A–N may be simultaneously activated in different ones of banks 105A–N. In those banks 105A–N that aren't coupled to input/output lines, activating a word line 130A–N couples charge onto data lines D1–DN and D1*–DN* that are isolated from corresponding input/output lines IO1–ION and IO1*–ION*, i.e. the charge from memory cells is coupled onto less capacitance, providing a larger voltage for sensing. Furthermore, since word lines 130A–N may be simultaneously activated in different ones of banks 105A–N, timing between certain memory operations may be reduced, or operations may be carried out simultaneously in different ones of banks 105A–N.

Figure 3A:
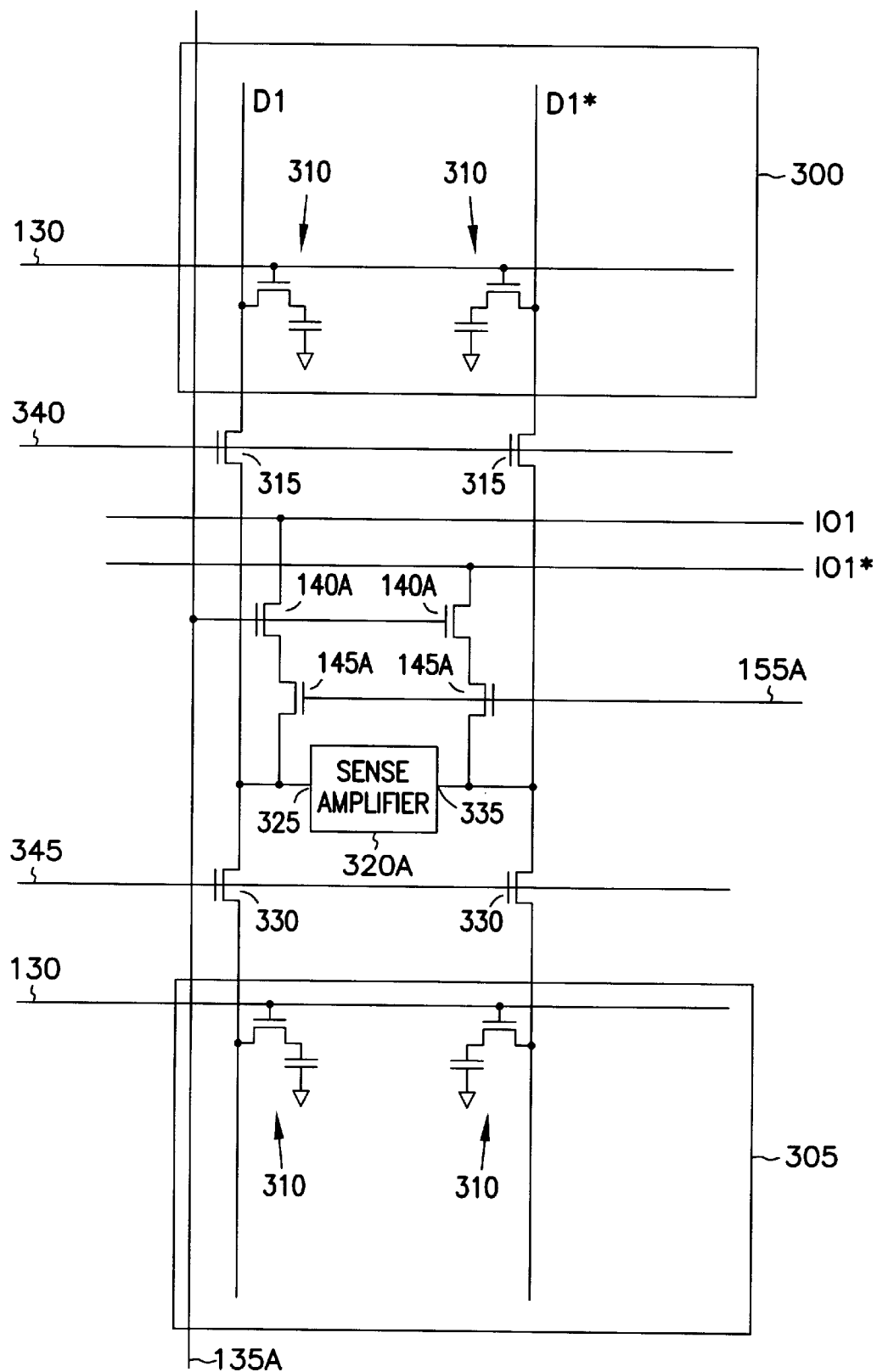
FIG. 3A is a schematic diagram illustrating generally an example of one embodiment of portions of a memory cell array bank, input/output switches, bank switches, and input/output lines.

FIG. 3A is a schematic diagram illustrating generally an example of one embodiment of portions of bank 105A, input/output switches 140A, bank switches 145A, and input/output lines IO1 and IO1*, which exemplify input/output lines IO1–ION and IO1*–ION*. In the particular embodiment of FIG. 3A, bank 105A is further divided into first memory cell block 300 and second memory cell block 305, each containing a plurality of memory cells, which are exemplified by memory cells 310. Each memory cell 310 includes a storage capacitor that is coupled by an access transistor (controlled by a word line 130) to one of digit lines D1–DN and D1*–DN*, which are exemplified by true digit line D1 and complementary digit line D1*.

In FIG. 3A, the digit lines D1–DN and D1*–DN* are each shared by a plurality of memory cells 310 in each of the first and second blocks 300 and 305. Portions of each digit line D1–DN and D1*–DN* in the first block 300 are optionally selectively coupled through an isolation switch, such as first block switch 315, to one of sense amplifiers 320A–N (e.g., to a first input 325 or second input 335 of sense amplifier 320A) that is shared between the first and second blocks 300 and 305. Corresponding portions of each digit line D1–DN and D1*–DN* in the second block 305 are selectively coupled through an isolation switch, such as second block switch 330, to the same one of sense amplifiers 320A–N (e.g., to the first input 325 or second input 335 of sense amplifier 320A) that is shared between the first and second blocks 300 and 305.

First and second block switches 315 and 330 receive respective first and second control signals 340 and 345 for selectively coupling first and second blocks 300 and 305 to sense amplifiers 320A–N. Each of digit lines D1–DN and D1*–DN* is also coupled to a corresponding one input/output lines IO1–ION and IO1*–ION* through first and second series-connected switches, e.g. one of input/output switches 140A–N and one of bank switches 145A–N. Each input/output switch 140A–N is selectable by column decoder 125. Each bank switch 145A–N is selectable by bank decoder 150. As described above, operation of bank switches 145A–N ensures that when a particular one of banks 105A–N is coupled to a corresponding one of input/ output lines IO1–ION and IO1*–ION*, the digit lines D1–DN and D1*–DN* in other ones of banks 105A–N are isolated from input/output lines IO1–ION and IO1*–ION*.

Figure 3B:
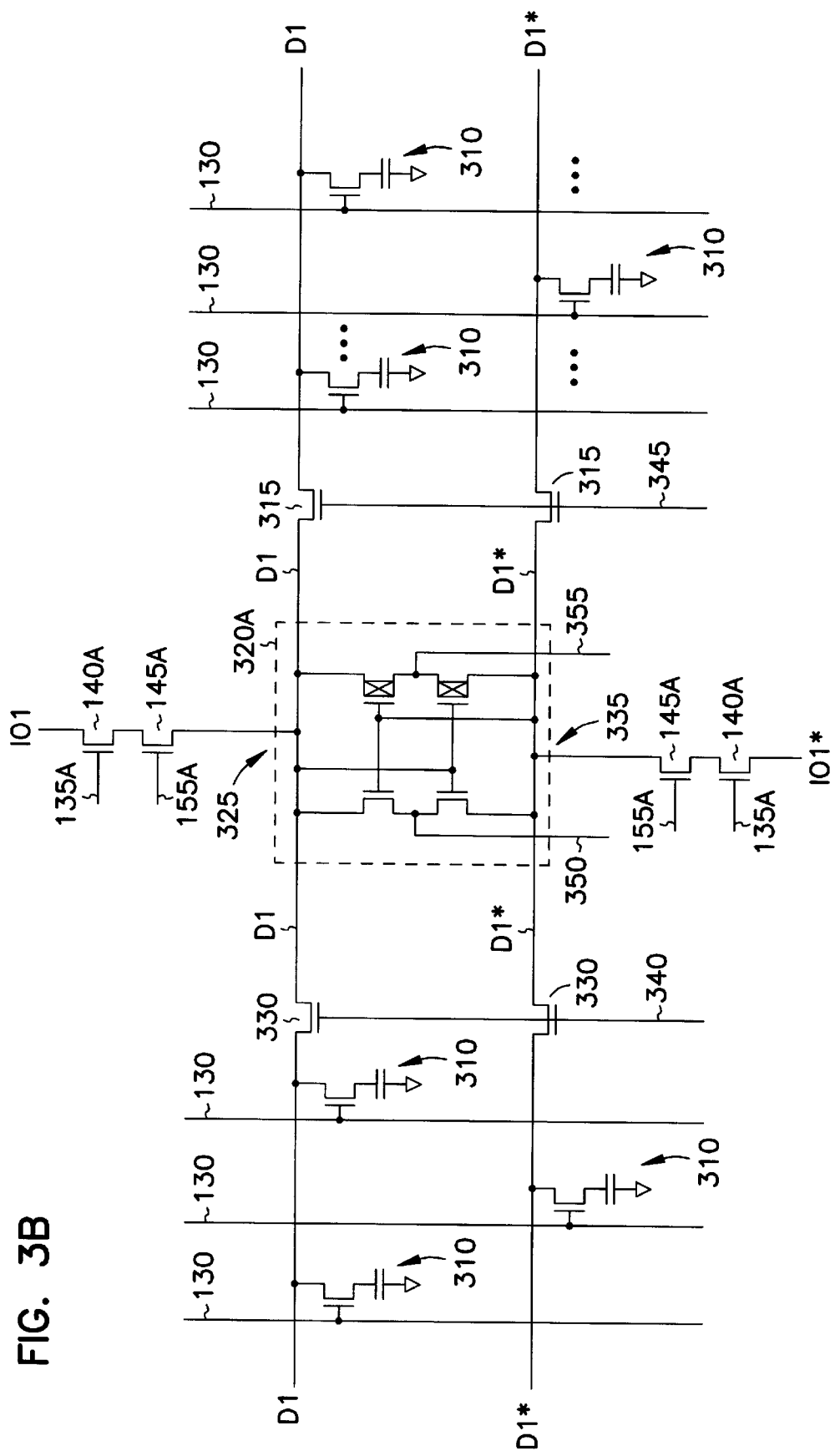
FIG. 3B is a schematic diagram of one embodiment of a portion of a column of a memory array.

FIG. 3B is a schematic diagram of a portion of a column of the memory array 105. The column schematic has been simplified to focus, by way of example, on certain elements needed to understand the present invention. True digit line D1 and corresponding complementary digit line D1* are used to couple common sense amplifier 320A with memory cells 310. The sense amplifier is known to those skilled in the art as having a cross-coupled n-sense amplifier half, and a cross-coupled p-sense amplifier half. Control signals 350 and 355 are coupled to the sense amplifier to selectively activate the cross-coupled n-sense amplifier half, and a cross-coupled p-sense amplifier half, respectively.

Figure 3C:
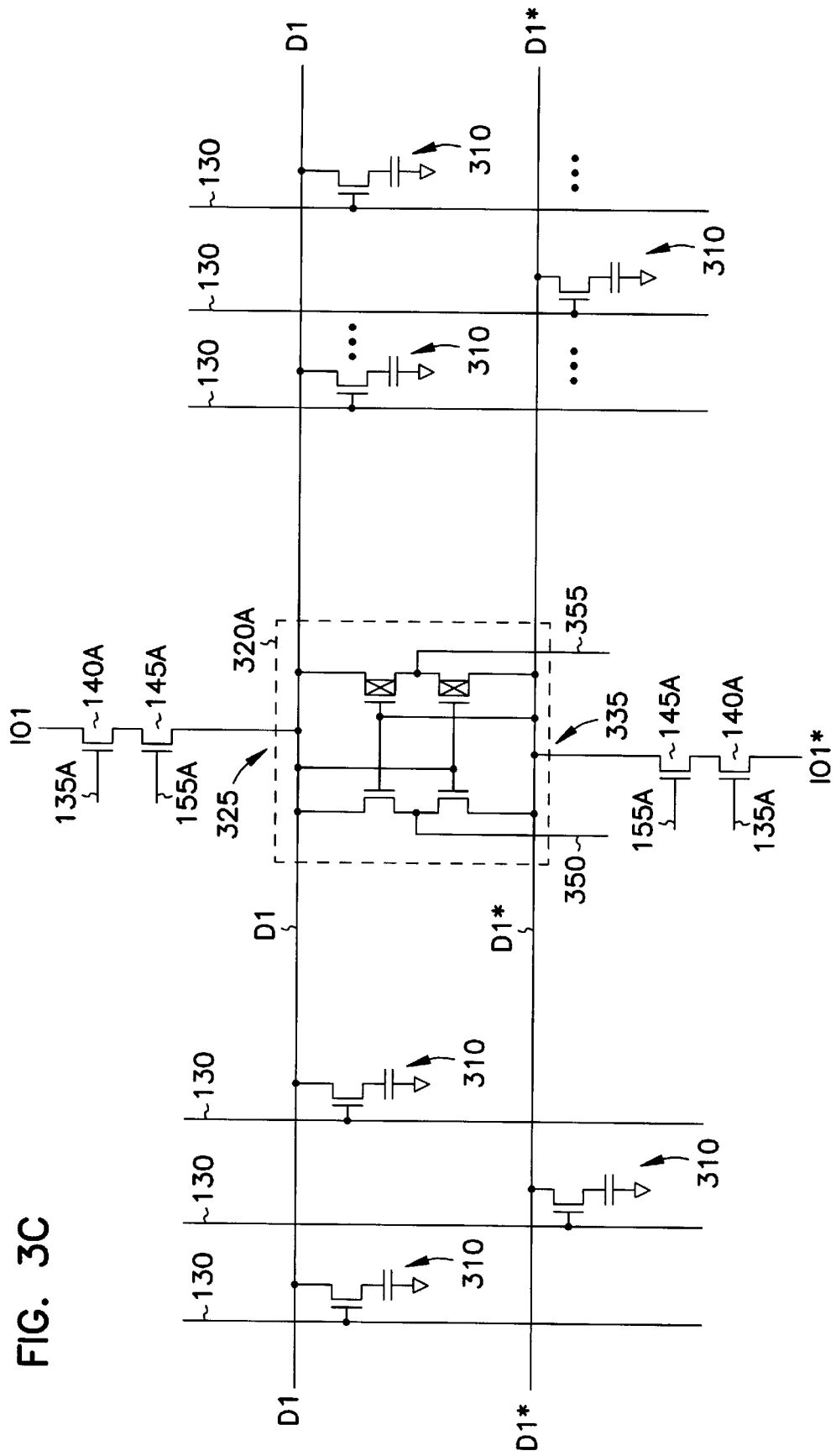
FIG. 3C is a schematic diagram of another embodiment of a portion of a column of a memory array.

Access transistors in memory cells 310 are selectively activated by a word line signal provided on word lines 130. In a read operation, a memory cell 310 is accessed through the access transistor and shares a charge stored thereon with a digit line such as D1 or D1*. One of digit lines D1 and D1*, therefore, experiences a change in voltage. The sense amplifier 320A is then coupled to the digit line pair D1 and D1* via optional isolation switches, such as first block switch 315 and second block switch 330 for sensing and amplifying a differential voltage between the digit line pair D1 and D1*, as known to one skilled in the art. The amplified voltage levels on each of digit lines D1 and D1* are then coupled to corresponding input/output lines IO1 and IO1* through first and second series-connected switches, such as bank switch 145A, controlled by a bank select signal at node 155A, and input/output switch 140A, controlled by a column select signal at node 135A. The isolation switches, such as first block switch 315 and second block switch 330 can be omitted, as illustrated in FIG. 3C.

Figure 4:
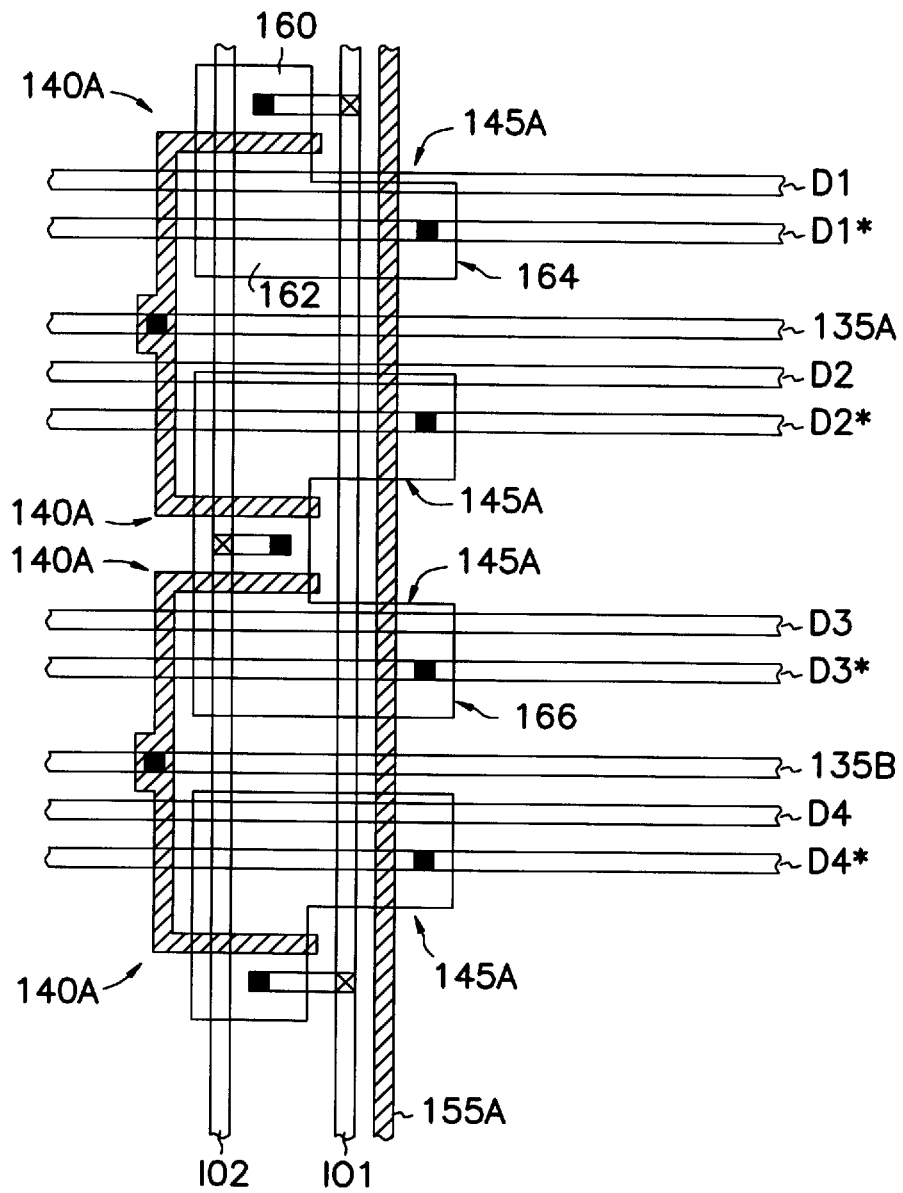
FIG. 4 is a physical layout diagram illustrating generally an example of one embodiment in which particular ones of the input/output switches and corresponding ones of the bank switches are arranged.

FIG. 4 is a physical layout diagram illustrating generally an example of one embodiment in which particular ones of input/output switches 140A–N and corresponding ones of bank switches 145A–N are arranged. In one embodiment, digit lines D1–DN and D1*–DN* and column select lines 135A–N run in a first metal interconnection layer in a first direction, e.g. the horizontal direction illustrated in FIG. 4. Input/output lines IO1–ION and IO1*–ION* run in a second metal interconnection layer in a second direction, e.g. the vertical direction illustrated in FIG. 4. Bank select lines 155A–N are run in a polysilicon interconnection layer in the second direction, and integrally forms the gates of corresponding field-effect transistor (FET) bank switches 145A–N. Column select lines 135A–N contact polysilicon gates of corresponding FET input/output switches 140A–N, source/drain regions 160 of which are coupled through first metal interconnection straps and through vias, illustrated by "X's", to ones of second metal input/output lines IO1–ION and IO1*–ION*.

In FIG. 4, input/output switches 140A and corresponding bank switches 145A share a common source/drain diffusion 162 at the particular node at which they are coupled. Furthermore, since bank lines 155A–N are, in one embodiment, orthogonally disposed to column select lines 135A–N and digit lines D1–DN and D1*–DN*, the input/output switches 140A and corresponding bank switches 145A can be laid out using a single L-shaped active area 164 to obtain the shared source/drain diffusion 162, as illustrated in FIG. 4. Adjacent ones of the L-shaped active areas can also be abutted to form U-shaped active areas 166 to conserve space, as illustrated in FIG. 4.

In operation, memory 100 allows banks 105A–N to be independently addressed, which advantageously allows memory operations to be performed on a first one of banks 105A–N, while other memory operations are performed on a second one of banks 105A–N. For example, in one embodiment memory 100 is operated by selecting a first bank, such as bank 105A. A memory operation is performed on bank 105A, such as a reading or writing operation. Memory cells 310 in bank 105A are coupled, through bank switches 145A and ones of column select switches 140A–N, to the input/output lines IO1–ION and IO1*–ION*. A second one of banks 105A–N, such as bank 105B, is then selected. A memory operation is then initiated upon memory cells 310 in bank 105B, while bank 105A is still coupled to the input/output lines IO1–ION and IO1*–ION*. Since the memory cells 310 in bank 105B are isolated from input/output lines IO1–ION and IO1*–ION* by respective bank switches 145B, the memory operation on bank 105B is unaffected by the coupling of bank 105A to the input/output lines IO1–ION and IO1*–ION*.

In one embodiment, the initiation of a memory operation on bank 105B while bank 105A is still coupled to the input/output lines IO1–ION and IO1*–ION* is the result of inadequate timing margin between the turning off of the column select switches 140A and the activating of a word line 130 in bank 105B. In such a situation, bank switches 145B operate to advantageously protect against potential loss of data in bank 105B. Without bank switches 145B, the data from each memory cell controlled by the activated word line 130 in bank 105B would be coupled onto a capacitance of both a corresponding one of digit lines D1–DN and D1*–DN* and also a capacitance of a corresponding one of input/output lines IO1–ION and IO1*–ION*. Bank switches 145B operate to ensure that the data from each memory cell 310 controlled by the activated word line 130 in bank 105B is coupled only onto a capacitance of a corresponding one of digit lines D1–DN and D1*–DN*. Thus, one aspect of the present invention allows timing margins to be reduced, allowing for faster throughput of memory operations such as reading and writing data to and from memory cells 310.

In another embodiment, the initiation of a memory operation on bank 105B while bank 105A is still coupled to the input/output lines IO1–ION and IO1*–ION* results not from inadequate timing margin, but from concurrent operation of portions of memory operations in different ones of banks 105A–N. Thus, another aspect of the present invention allows portions of memory operations in different ones of banks 105A–N to overlap in time, also allowing for faster throughput of memory operations such as reading and writing data to and from memory cells.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A memory comprising:
   an array of memory cells arranged in separately addressable banks;
   input/output lines for communicating data between the memory cells and external connections;
   a column decoder for providing column select signals, each column select signal for selecting columns of memory cells in more than one bank for coupling to one of the input/output lines; and
   a bank decoder for individually selecting each of the banks for coupling columns of memory cells in the selected bank to ones of the input/output lines, and for isolating columns of memory cells in other banks from ones of the input/output lines.

2. The memory of claim 1, further comprising:

bank switches controlled by the bank decoder, each bank switch coupling one of the input/output lines to one of the banks;

digit lines in each bank that are coupled to memory cells therein; and input/output switches, each input/output switch controlled by a column select signal for coupling one of the digit lines in one of the banks to one of the input/output lines through one of the bank switches.

3. A memory comprising a column of memory cells arranged in separately addressable banks, the memory cells being selectively coupled to an input/output line through first and second series-coupled switches, wherein the first switch is an input/output switch that is controlled by a column select signal, and the second switch is a bank switch that is controlled by a bank select signal.

4. The memory of claim 3, further comprising a bank decoder providing the bank select signal independently to each bank, the bank select signal addressing one of the banks for access while isolating the other banks.

5. The memory of claim 3, wherein the first and second switches are transistors, and a source/drain of the first switch is directly connected to a source/drain of the second switch.

6. The memory of claim 5, wherein the memory is an integrated circuit memory and the directly connected source/drains of the first and second switches are fabricated as a common diffusion region.

7. The memory of claim 6, wherein the first and second switches share an L-shaped active area.

8. A memory comprising:

an array of memory cells arranged in separately addressable banks;

input/output lines for communicating data between the memory cells and external connections;

a column decoder for providing column select signals, each column select signal for selecting columns of memory cells in more than one bank for coupling to one of the input/output lines;

a bank decoder for individually selecting each of the banks for coupling columns of memory cells in the selected bank to ones of the input/output lines, and for isolating columns of memory cells in other banks from ones of the input/output lines;

bank switches controlled by the bank decoder, each bank switch coupling one of the input/output lines to one of the banks;

digit lines in each bank that are coupled to memory cells therein; and input/output switches, each input/output switch controlled by a column select signal for coupling one of the digit lines in one of the banks to one of the input/output lines through one of the bank switches;

word lines in each bank that are coupled to ones of the memory cells therein, each word line defining a row of memory cells; and a row decoder, controlling each word line for selecting a row of memory cells for coupling to ones of the digit lines in one of the banks.

9. The memory of claim 8, wherein each bank includes:

sense amplifiers, each sense amplifier coupled to ones of the digit lines;

first isolation switches, each first isolation switch coupling a portion of one of the columns of memory cells in a first block to one of the sense amplifiers; and second isolation switches, each second isolation switch coupling a portion of one of the columns of memory cells in a second block to one of the sense amplifiers.

10. A method of using a memory cell array including memory cells arranged in separately addressable banks that share column select signals for addressing the memory cells, the method comprising the steps of:

selecting a first bank;

performing a memory operation upon memory cells in the first bank;

coupling memory cells in the first bank to input/output lines using the column select signals that are shared between the separately addressable banks;

selecting a second bank; and initiating a memory operation upon memory cells in the second bank while the first bank is coupled to the input/output lines.

11. The method of claim 10, further comprising the step of decoding a received address before each of the steps of selecting the first bank and selecting the second bank.

12. The method of claim 10, further comprising the step of isolating memory cells in other banks from input/output lines before coupling memory cells in the first bank to input/output lines.

13. The method of claim 10, further comprising the step of isolating memory cells in other banks from input/output lines before performing a memory operation upon memory cells in the first bank, wherein performing a memory operation upon memory cells in the first bank includes addressing memory cells in the first bank using a signal that is shared between more than one of the banks.

14. A method of coupling memory cells in a multi-bank memory to input/output lines, the method comprising the steps of:

selecting columns of memory cells in multiple banks based upon a column select signal that is shared between the banks;

coupling the selected columns of memory cells in the multiple banks through respective input/output switches to input/output lines;

selecting a bank of memory cells based upon a bank select signal that is decoded from an address; and coupling the selected columns of memory cells in only the selected bank through respective bank switches to input/output lines.

15. The method of claim 14, in which the input/output lines are shared between more than one of the banks.

16. A method of coupling a column of memory cells to an input/output line, the method comprising the steps of:

selecting the column of memory cells based upon a column select signal that is shared between different banks of the memory cells; and coupling the selected column of memory cells to the input/output line through an input/output switch and through a bank switch that is in series with the input/output switch, wherein the act of coupling includes activating the bank switch of a particular bank one of the banks using a bank select signal provided by a bank decoder, and isolating the other banks from the input/output lines using other bank select signals provided by the bank decoder.

17. An electronic system, comprising:

a memory, including:

an array of memory cells arranged in separately addressable banks;

input/output lines for communicating data between the memory cells and external connections; and a column decoder for providing column select signals, each column select signal for selecting columns of memory cells in more than one bank for coupling to one of the input/output lines;

a bank decoder for individually selecting each of the banks for coupling columns of memory cells in the selected bank to input/output lines, and for isolating columns of memory cells in other banks from input/output lines;

bank switches controlled by the bank decoder, each bank switch coupling one of the input/output lines to one of the banks;

digit lines in each bank that are coupled to memory cells therein;

input/output switches, each input/output switch controlled by a column select signal for coupling one of the digit lines in one of the banks to one of the input/output lines through one of the bank switches;

word lines in each bank that are coupled to ones of the memory cells therein, each word line defining a row of memory cells; and a row decoder, controlling each word line for selecting a row of memory cells for coupling to ones of the digit lines in one of the banks; and an external circuit, providing address signals to the memory that include the address signal received by the bank decoder, providing control signals to the memory, and communicating data to and from the memory.

* * * * *